United States Patent
Greim et al.

(10) Patent No.: US 7,367,839 B2
(45) Date of Patent: May 6, 2008

(54) FEED LINE FOR A LOCAL COIL FOR MAGNETIC RESONANCE IMAGING WITH STANDING WAVE BARRIER INTEGRATED INTO THE PLUG THEREOF

(75) Inventors: Helmut Greim, Adelsdorf (DE); Jürgen Hagen, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 11/493,105

(22) Filed: Jul. 25, 2006

(65) Prior Publication Data
US 2007/0026733 A1 Feb. 1, 2007

(30) Foreign Application Priority Data
Jul. 26, 2005 (DE) .................. 10 2005 034 914

(51) Int. Cl.
H01R 9/05 (2006.01)
H01R 9/03 (2006.01)
H01R 13/66 (2006.01)
H01R 33/945 (2006.01)

(52) U.S. Cl. .................. 439/581; 439/610; 439/620.09

(58) Field of Classification Search .................. 439/581, 439/580, 610, 620.09
See application file for complete search history.

(56) References Cited

U.S. PATENT DOCUMENTS

| 3,212,015 | A | * | 10/1965 | Kruse, Jr. .................. 327/583 |
| 3,873,785 | A | * | 3/1975 | Lieberman .................. 200/51.1 |
| 5,065,760 | A | | 11/1991 | Krause et al. |
| 6,019,635 | A | * | 2/2000 | Nelson .................. 439/583 |
| 6,243,654 | B1 | * | 6/2001 | Johnson et al. .................. 702/85 |
| 6,283,790 | B1 | * | 9/2001 | Idehara et al. .................. 439/582 |
| 6,822,846 | B2 | | 11/2004 | Reykowski |
| 2005/0250381 | A1 | * | 11/2005 | Hellin .................. 439/578 |

FOREIGN PATENT DOCUMENTS

DE 34 30 659 A1 3/1986

* cited by examiner

Primary Examiner—Hae M Hyeon
(74) Attorney, Agent, or Firm—Schiff Hardin LLP

(57) ABSTRACT

Feed line for at least one local coil in a magnetic resonance tomography apparatus, comprising at least one coil plug as well as at least one standing wave barrier for suppression of unwanted radio-frequency currents on a conductor cable of the feed line, with the standing wave barrier integrated into the coil plug.

21 Claims, 2 Drawing Sheets

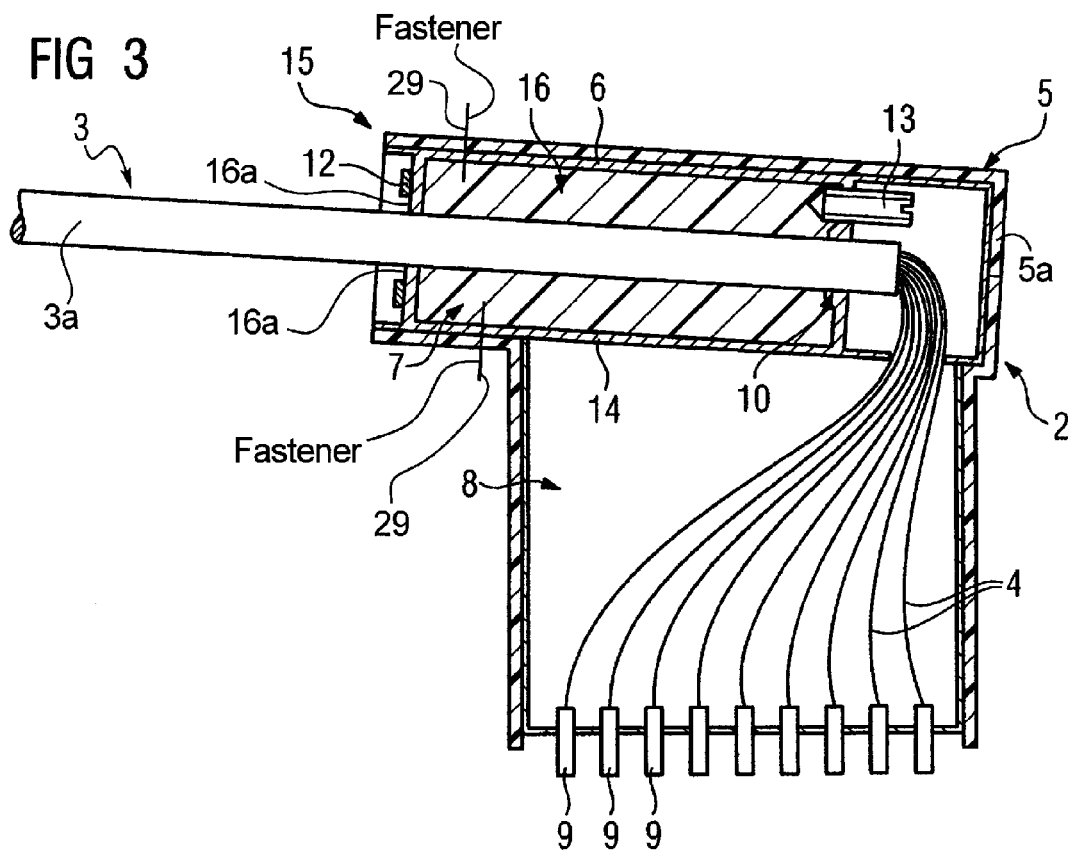
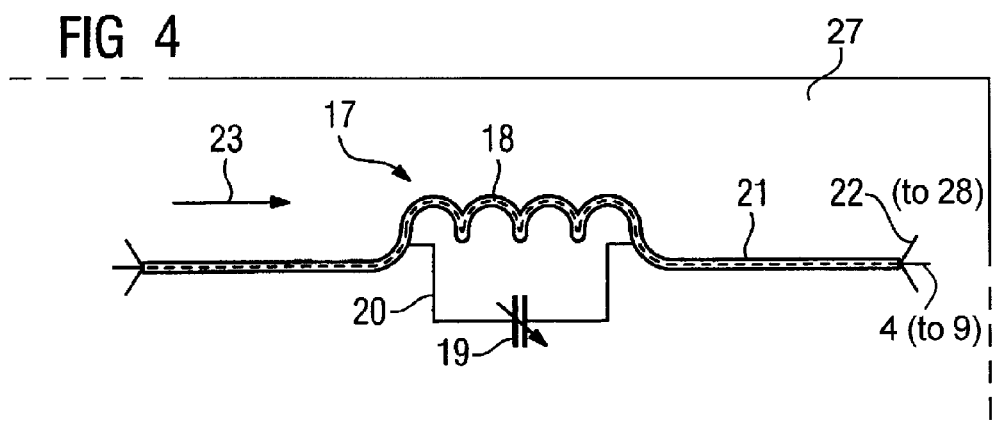
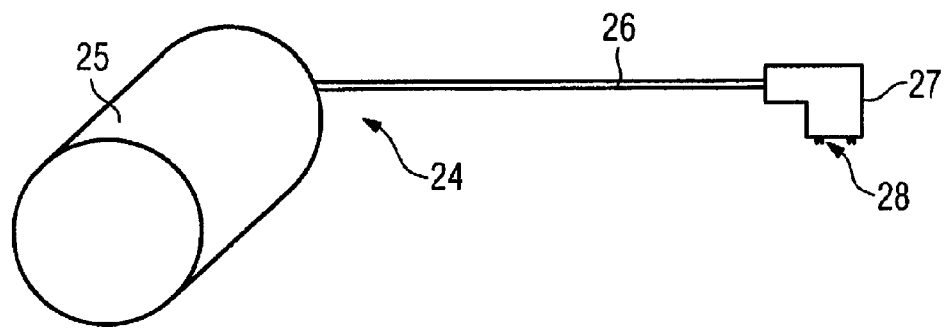

FEED LINE FOR A LOCAL COIL FOR MAGNETIC RESONANCE IMAGING WITH STANDING WAVE BARRIER INTEGRATED INTO THE PLUG THEREOF

BACKGROUND OF THE INVENTION

1. Field of the Invention

The present invention concerns a feed line for at least one local coil of a magnetic resonance tomography apparatus, of the type having at least one coil plug as well as at least one standing wave barrier to suppress unwanted radio-frequency currents on the conductor cable of the feed line.

2. Description of the Prior Art

For the implementation of measurements in the field of nuclear magnetic resonance tomography, radio-frequency coils in the form of local coils are used for the acquisition of alternating electromagnetic fields. To fulfill the need to optimize the signal-to-noise ratio, radio-frequency coils for different body regions of the patient to be examined are optimized with regard to geometry and their acquisition profile. An optimally close positioning of the local coils on the body of the patient enables a high value to be attained for the signal-to-noise ratio.

The local coils used in magnetic resonance tomography normally are designed as pure acquisition coils, with the spin excitation that causes emission of the magnetic resonance signals to be detected, ensuring with a whole-body resonator. A radio-frequency cable is necessary for transfer of the signal from coils to the acquisition system of the associated magnetic resonance system.

In the transmission mode of a measurement, the electromagnetic fields induce radio-frequency currents on the conductor shields of the cables of the feed lines for the local coils. These radio-frequency currents, known as standing waves can lead to image distortions or even to an injury to the patient. Standing wave barriers for suppression of these radio-frequency currents on the outer conductor of the cable accordingly are inserted into the feed lines of the local coils. The standing wave barriers (representing high-ohmic impedances) suppress the unwanted radio-frequency currents on the lines.

During data acquisition with the magnetic resonance system, the standing wave barriers rest on the patient. They must be maintained at a safe distance from the patient, which is why they are surrounded with a plastic housing. This leads to the situation that the standing wave barriers of the feed lines for the local coils exhibit a certain size and thus appear unwieldy and reduce the examination comfort for the patient.

SUMMARY OF THE INVENTION

An object of the present invention is to provide a feed line for local coils that is improved with regard to the bulkiness exhibited by conventional feed lines of the type described above.

This object is achieved in accordance with the invention by a feed line of the aforementioned type wherein the standing wave barrier is integrated into the coil plug.

Since the coil plug itself has the standing wave barrier integrated therein, in the inventive feed line a further component such as a plastic housing or the like is no longer required for placement on the patient. Instead, a space that is present anyway, namely the housing of the plug, is used for the additional function of suppression of the standing waves. An enlargement of the coil plug is normally not necessary since, for example, the region that is present anyway for strain relief of the cable can be used.

With the inventive feed line for local coils, the advantage is achieved that the standing waves are directly suppressed at the point of origin, so a reduction of the number of the standing barriers is possible, and the comfort for the patient during a scan is increased. The previously-required application of the standing wave barrier on the individual conductor cables in surrounding housings for maintaining a safe distance from the patient is omitted in favor of usage of a space present in the coil plug.

The coil plug of the feed line can be fashioned with two chambers that are electrically shielded from one another, in particular a first chamber serving for the insertion of the conductor cable and a second chamber serving as a plug region for feeding the conductor cable to associated plug pins. The second chamber is separated from the first chamber by a separation element. In this case, the chamber for cable insertion serves as a space available for the integration of the standing wave barrier. The electrical shielding of both chambers from one another is achieved, for example, by a metallic element similar to a baffle. It is then merely necessary for the individual lines to be conducted from one chamber into the other in spite of the baffle. Openings in the baffle are to be provided for this purpose.

The standing wave barrier is appropriately fashioned as a resonant standing wave barrier, in particular with at least one wound coil or at least one elongated conductor to form a barrier cavity. A resonance barrier with a wound coil is to be used at low frequencies in a scan, in which case however fewer problems with regard to the generation of standing waves occur than at high magnetic resonance frequencies. With a capacitor connected in parallel, the winding forms a resonant circuit, the resonance frequency thereof being tuned to the magnetic resonance frequency.

Furthermore, the resonant standing wave barrier can be fashioned with an extended conductor such that a barrier cavity is created. Furthermore, given such a λ/4 barrier cavity, connections are provided to an external metallic layer (for example to a copper layer) and moreover shortening capacitors are provided for electrical shortening. The barrier cavity exhibits a specific length that is tuned to the wavelength of the respective electromagnetic waves. The resulting high-ohmic impedance suppresses the induced radio-frequency currents.

Given design of the standing wave barrier as a barrier cavity, the shield of the conductor cable can be electrically connected with an inner metallization of the housing of the coil plug by a suitable connection. The cable thus can be directed, for example, in an electrically-insulated manner up to the end of the first chamber of the coil plug serving for cable insertion, in order to be connected, at that location (the aforementioned end of the first chamber) in an electrically-conductive manner with the metallization of the plug housing through an opening. The connection is formed, for example, by a metallic disc with a central opening corresponding to the diameter of the cable which, if applicable, is attached on an additional mounting element to mount the disc relative to (opposite) the cable or the housing of the plug.

The conductor cable can be provided with a fixing element for attachment in the housing of the coil plug. The fixing element can be at least partially composed of plastic. This fixing element can be identical the element that serves as a mounting for a possibly-present connection metallization. The fixing element can be necessary in order to prevent cable movement in the housing and thus a possible limitation of the functionality of the standing wave barrier. For example, an element essentially composed of plastic with a front-side metallization corresponding to the cross-section direction of the affixed conductor cable can be used as the fixing element.

According to the invention, the fixing element can be formed by multiple parts, in particular two parts, and/or the conductor cable can be surrounded on all sides by segments. For example, two or more plastic parts, possibly with a connection element for the electrical connection with an inner metallization of the housing, can be added to a cylindrical element with an opening for passing the conductor cable therethrough. For this purpose, the multiple components of the fixing element can be plugged together. Alternatively, the multiple components can be connected with one another in a detachable or non-detachable manner, for example by clipping or gluing or bolting.

The fixing element can be mounted in the housing of the coil plug (in particular a chamber serving for cable insertion) with a positive fit, or by a fastener, in particular by clamping and/or screwing and/or a clip retainer. For example, a reliable operation of the standing wave barrier without cable movement is achieved by clamping in connection with a fitting shape of the fixing element, such that the connection element actually contacts the inner metallization of the housing. The standing wave barrier can thus, for example, be simply mounted given a clamp or clip retention or via bolting, for example with the aid of plastic screws that can also serve for connection of a number of parts of the fixer element.

The fixing element, as already mentioned, can include connection (in particular in the form of a connection metallization) for electrical connection of the shield of the conductor cable with an inner metallization of the housing of the coil plug. The connection metallization, for example, can be a front-side metallization of a cylindrical body otherwise formed of plastic. The connection with the housing metallization that is required to form a barrier cavity is thus achieved.

Furthermore, given formation of the standing wave barrier as a barrier cavity, at least one capacitor serving for the electrical shortening is appropriately provided. The conductor cable with the shield of the housing is extended by these shortening capacitors to a λ/4 barrier cavity. An appropriate formation results with inter-soldered capacitors that, starting from the cable cross-section, are respectively soldered between the cable and the plug housing at an essentially right angle relative to one another and relative to the housing metallization.

The capacitor can be arranged between the shield of the conductor cable and the inner metallization of the housing of the coil plug, in particular at the fixing element that fixes the conductor cable in the housing of the coil plug. Naturally, the capacitor or capacitors can be directly, permanently soldered between the shield of the housing and the cable shield with corresponding conductors, independently of the fixing element. Given an attachment on an existing fixing element, however, the advantage results that the significant elements of the standing wave barrier can be integrated into the coil plug in the form of a single (possibly multi-part) component.

The standing wave barrier furthermore can be fashioned with a tuning element for frequency tuning, in particular with a screw formed of copper. The standing wave barrier is exactly tuned to the magnetic resonance frequency by turning the screw in or out or by tuning of another tuning element. By advancing a copper screw into the chamber for the cable insertion, the inductance is reduced and thus the resonant frequency of the resonant standing wave barrier is shifted upwardly.

The tuning element can be accessible through a closeable opening in the housing of the coil plug, such as an opening in the chamber serving for the cable insertion. For this purpose, for example, an opening of the coil plug serving servicing can be used so that tuning the resonance frequency or possibly a correction, can be made at any time, for example during maintenance measures or changes to the scan conditions.

The invention also concerns a local coil that is shielded with a feed line as described above. Given a corresponding number of conductor cables, the feed line can serve for conducting the signals from a local coil with a number of separate windings. The windings can be spatially separated such that in practice a number of local coils or sub-coils can exist for which a single coil plug with a correspondingly-tuned standing wave barrier is sufficient for suppression of standing waves when the conductors of the sub-coils are merged into a conductor cable. The number of the required standing wave barriers is thus reduced since a separate standing wave barrier is not required for each separate coil with the corresponding conductor.

DESCRIPTION OF THE DRAWINGS

FIG. 3 is a lateral section through a feed line with a fixing element in accordance with the invention.
FIG. 4 is a circuit diagram of a resonant standing wave barrier with a wound coil in accordance with the invention.
FIG. 5 shows an inventive local coil.

DESCRIPTION OF THE PREFERRED EMBODIMENTS

Figure 1:
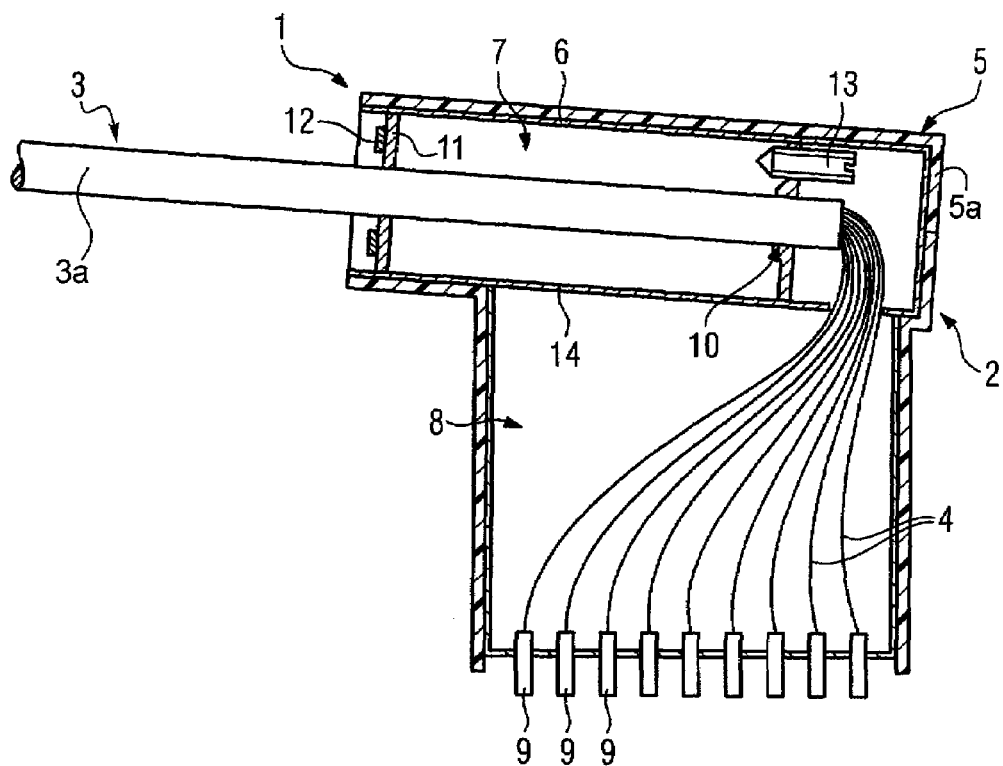
FIG. 1 is a lateral section through an inventive feed line.

A lateral section through an inventive feed line 1 is drawn in FIG. 1. The feed line has a coil plug 2 as well as a conductor cable 3 with a number of conductors 4 and a shielding 3*a*. The coil plug 2 is formed by shock-resistant plastic. The housing 5 thereof has a metallization 6 on the inside. The housing 5 of the coil plug comprises two chambers 7, 8. The first chamber 7 serves for the insertion of the conductor cable 3 while the second chamber 8 represents the plug region in which the individual conductors 4 are supplied to the plug pins 9. Via plug pins 9, the acquired signals are transferred from the local coil or local coils (not shown) to the acquisition system of the magnetic resonance system.

The first chamber 7 and the second chamber 8 are electrically shielded from one another. The first chamber 7 is designed such that it represents a shielded standing wave barrier that in this case is fashioned as a λ/4 barrier cavity. For this purpose, the conductor cable 3 is insulated and directed up to the end of the chamber 7, where a feedthrough 10 is located via which the common shielding of the conductors 4 is connected in an electrically-conductive manner with the metallization 6 of the plug housing. In the input region of the first chamber 7 of the coil plug 2, capacitors 12 are soldered between the common shield of the conductor cable 3 and the inner metallization 6 of the plug housing 5 via a corresponding connection 11. The capacitors serve as shortening capacitors that extend the conductor cable 3 with the shield of the plug housing 5 to a barrier cavity.

A high impedance for a standing wave thereby arises in the region of the cable insertion of the first chamber 7, such that this standing wave is suppressed. Furthermore, a tuning screw 13 made from copper is provided that can be turned into the first chamber 7 via a closeable rear service opening 5a of the first chamber 7. The tuning screw 13 made from copper serves for the exact tuning of the standing wave barrier to the magnetic resonance frequency. By turning in the tuning screw 13, the inductivity is reduced and thus the resonance frequency of the standing wave barrier is shifted upwards.

The standing wave barrier is thus integrated into the inventive feed line 1 in the housing 5 of the coil plug 2 without a fundamental change of the design of the coil plug 2 being hereby necessary. Rather, a region that must be present anyway for strain relief is expanded via a division 14 into a chamber 7 that is electrically shielded from a second chamber 8. The standing wave barrier thus can be integrated without problems into the housing 5 of the coil plug 2. The standing waves are therewith suppressed at the point of origin while at the same time a reduction of the number of the standing wave barriers is possible. The standing wave barriers resting on the patient and surrounded with a plastic housing, as have previously been typical, are dispensed with to increase the patient comfort.

Figure 2:
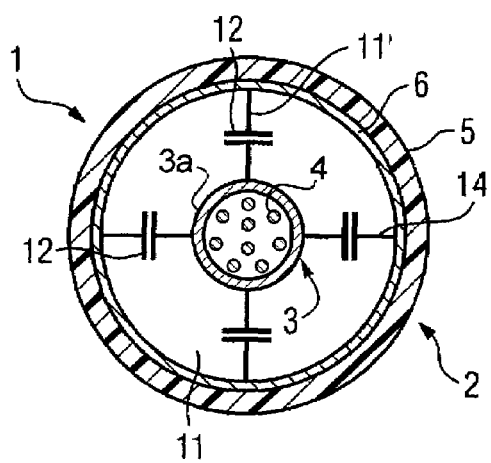
FIG. 2 is a cross-section through the feed line of FIG. 1.

A cross-section through the feed line 1 of FIG. 1 is shown in FIG. 2. This cross-section shows the input region of the first chamber 7 with the connection 11 via which the conductor cable 3 is fixed against unwanted movements. The connection 11 is arranged between the housing 5 of the coil plug 2 with the inner metallization 6 and the conductor cable 3. Capacitors 12 with connection conductors 11' for producing an electrical connection are soldered between a shield 3a of the conductor cable 3 and the inner metallization 6 of the housing 5, which capacitors 12 serve as shortening capacitors for extension of the λ/4 barrier cavity.

FIG. 3 shows a lateral section through a feed line 15 with a fixing element 16 essentially extending over the length of a chamber 7 serving for cable insertion. To simplify the representation, corresponding components are designated with the same reference characters as in FIG. 1. In contrast to the feed line 1 of FIG. 1, in the feed line 15 of FIG. 3 a fixing element 16 is provided that is fashioned as continuous from an input region of the first chamber 7 up to the end region of the chamber 7, in which the shield of the conductor cable 3 is connected with the inner metallization 6 of the housing 5.

The fixing element 16 is formed by two parts that respectively surround the conductor cable 3 as semi-circles and are clamped for fixing into the housing 5. The size of the semi-circles is correspondingly adapted for this. Both parts (not recognizable here) of the fixing element 16 are composed of plastic that is joined with screws. A metallization 16a is provided on the front surfaces in order to produce the electrical connection from the shield of the conductor cable 3 to the inner metallization 6 of the housing 5. The metallization 16a can extend into the inner region of the parts (wherein the cable shield is directed in a clamped state) and to the outside of the parts.

Such a fixing element 16 fashioned as continuous allows an easy mounting in the housing 5 of the coil plug 2. For example, as shown in FIG. 3, the fixing element 16 directly abuts the inner metallization 6 of the housing 5, thereby forming a positive fit therewith. Additionally, or alternatively, one or more fasteners 29 (schematically illustrated in FIG. 3) can be used to hold the fixing element 16 in the housing 5. The fasteners 29 may be, for example, clamps or screws or clips.

Finally, FIG. 4 shows a principle drawing of a resonant standing wave barrier 17 with a wound conductor 18 that is fashioned as a coil. Together with the likewise-present capacitor 19 that is arranged (via a corresponding connection conductor 20) parallel to the wound conductor 18 forming a coil, a parallel resonance is fashioned whereby the resonant circuit is tuned to the magnetic resonance frequency. The unwanted radio-frequency currents, the feed direction of which on the conductor cable 21 is symbolized by the arrow 23 with the indicated conductors 22, are effectively suppressed.

As schematically indicated in FIG. 4, the resonant standing wave barrier 17 can be integrated in the plug 27, with the conductors 22 leading to discharge plug pins 28, and the inner conductor 4 (only one of which is shown in FIG. 4) leading to one of the aforementioned pins 9.

A design with coils or wound conductors 18, similar to as shown here and if applicable with an external copper cylinder for shielding or the like, can be inserted into a plug housing (not shown here) similar to as given the formation as a barrier cavity. The resonant standing wave barrier with a wound conductor 18 serves for use at lower frequencies while the realization as a barrier cavity is used at higher frequencies.

An inventive local coil 24 is shown in FIG. 5, wherein antenna windings 25 (that are indicated here by a cylindrically-fashioned body) are connected with a plug 27 via a conductor cable 26. A standing wave barrier as described in the preceding is integrated into the plug 27. As noted above plug pins 28 enable a discharge of the signals (pins 9 being omitted for clarity).

The windings 25 shown in the cylindrical representation are merely an example. Naturally a different geometric design as well as a spatial separation of individual windings with possibly separate conductors that are integrated into the conductor cable 26 are also possible. The external design of the local coil 24 with the standing wave barrier (which is not shown for clarity) integrated into the plug 27 differs from conventional local coils in that the standing wave barriers which limit the patient comfort and are placed on the patient, which standing wave barriers are externally attached around the conductor cables, are omitted. Overall a simpler design thus results with which it is achieved that the examination proceeds more comfortably for the patient than previously while at the same time a reliable suppression of the unwanted radio-frequency currents is ensured.

Although modifications and changes may be suggested by those skilled in the art, it is the intention of the inventors to embody within the patent warranted hereon all changes and modifications as reasonably and properly come within the scope of their contribution to the art.

We claim as our invention:

1. A feed line for a local magnetic coil for magnetic resonance imaging, comprising:
   a conductor cable having a first end configured for connection to a local coil for magnetic resonance imaging and terminating in a plug at a second end; and
   at least one standing wave barrier integrated in said plug that suppresses unwanted radio-frequency currents on said conductor cable that arising during operation of said local coil for magnetic resonance imaging.

2. A feed line as claimed in claim 1 wherein said plug comprises a plug pin and first and second plug chambers separated from each other by a separation element and electrically shielded from each other, said first chamber receiving said conductor cable from an exterior of said plug, and said second chamber having said conductor cable fed therethrough to said plug pin.

3. A feed line as claimed in claim 2 wherein said standing wave barrier is a resonant standing wave barrier comprising a barrier cavity formed in said first chamber and a conductor section extending through said barrier cavity.

4. A feed line as claimed in claim 3 wherein said plug comprises a housing having an inner metallization surrounding said barrier cavity, and wherein said conductor cable comprises cable shielding electrically connected to said inner metallization of said housing.

5. A feed line as claimed in claim 1 wherein said plug comprises a housing, and wherein said conductor cable comprises a fixing element attaching said conductor cable to said housing of said plug.

6. A feed line as claimed in claim 5 wherein said fixing element is comprised of plastic.

7. A feed line as claimed in claim 5 wherein said fixing element is comprised of multiple parts.

8. A feed line as claimed in claim 7 wherein said fixing element is comprised of a plurality of segments that, in combination, completely surround an exterior of said conductor cable.

9. A feed line as claimed in claim 5 wherein said fixing element is held in said housing with a positive fit.

10. A feed line as claimed in claim 5 wherein said fixing element is held in said housing by a fastener.

11. A feed line as claimed in claim 5 wherein said housing comprises an inner metallization, and wherein said fixing element additionally forms an electrical connection between said conductor cable and said inner metallization.

12. A feed line as claimed in claim 1 wherein said standing wave barrier comprises at least one capacitor for electrical shortening.

13. A feed line as claimed in claim 12 wherein said plug comprises a housing with an inner metallization, and wherein said conductor cable comprises a cable shielding, and wherein said at least one capacitor is electrically connected between said cable shielding and said inner metallization.

14. A feed line as claimed in claim 13 comprising a fixing element that attaches said conductor cable to said housing, and wherein said capacitor is disposed at said fixing element.

15. A feed line as claimed in claim 1 wherein said standing wave barrier comprises a tuning element for frequency tuning.

16. A feed line as claimed in claim 15 wherein said tuning element comprises a screw that is advanceable into and out of said standing wave barrier.

17. A feed line as claimed in claim 16 wherein said screw is comprised of copper.

18. A feed line as claimed in claim 15 wherein said tuning element comprises a mechanically adjustable element, and wherein said plug comprises a housing having a closeable service opening therein allowing mechanical access to said mechanically adjustable element.

19. A feed line as claimed in claim 18 wherein said plug comprises a plug pin and first and second plug chambers separated from each other by a separation element and electrically shielded from each other, said first chamber receiving said conductor cable from an exterior of said plug, and said second chamber having said conductor cable fed therethrough to said plug pin, said mechanically adjustable element being disposed in said separation element.

20. A local coil for magnetic resonance imaging comprising:
    at least one antenna element configured to receive magnetic resonance signals;
    a cable conductor electrically connected at a first end thereof to said at least one antenna element and terminating at a second, opposite end with a plug; and
    a standing wave barrier integrated in said plug that suppresses unwanted radio-frequency currents on said cable conductor that arising during operation of said local coil for magnetic resonance imaging.

21. A feed line as claimed in claim 1 wherein said plug comprises a plug housing, and wherein said standing wave barrier is a resonant standing wave barrier consisting of a wound coil contained in said plug housing.

* * * * *